United States Patent
Myung et al.

(10) Patent No.: US 9,054,741 B2
(45) Date of Patent: Jun. 9, 2015

(54) METHOD AND APPARATUS FOR TRANSMITTING AND RECEIVING IN A COMMUNICATION/BROADCASTING SYSTEM

(75) Inventors: Se-Ho Myung, Seoul (KR); Hong-Sil Jeong, Seoul (KR)

(73) Assignee: Samsung Electronics Co., Ltd (KR)

(*) Notice: Subject to any disclaimer, the term of this patent is extended or adjusted under 35 U.S.C. 154(b) by 163 days.

(21) Appl. No.: 13/412,239

(22) Filed: Mar. 5, 2012

(65) Prior Publication Data

US 2012/0226956 A1    Sep. 6, 2012

(30) Foreign Application Priority Data

Mar. 3, 2011 (KR) .................. 10-2011-0018740

(51) Int. Cl.
- *H03M 13/11* (2006.01)
- *H03M 13/00* (2006.01)
- *H04L 1/00* (2006.01)
- *H04L 1/18* (2006.01)
- *H03M 13/53* (2006.01)

(52) U.S. Cl.
CPC ........ *H03M 13/1165* (2013.01); *H03M 13/618* (2013.01); *H03M 13/6306* (2013.01); *H03M 13/6393* (2013.01); *H04L 1/0009* (2013.01); *H04L 1/0041* (2013.01); *H04L 1/0057* (2013.01); *H04L 1/1819* (2013.01)

(58) Field of Classification Search
CPC .......... H03M 13/618; H03M 13/1165; H03M 13/6306; H03M 13/6393; H04L 1/0057; H04L 1/0041; H04L 1/0009; H04L 1/1819
See application file for complete search history.

(56) References Cited

U.S. PATENT DOCUMENTS

| | | | |
|---|---|---|---|
| 7,313,752 B2 | 12/2007 | Kyung et al. | |
| 7,783,961 B2 * | 8/2010 | Yue et al. | 714/790 |
| 2005/0204273 A1 * | 9/2005 | Jeong et al. | 714/801 |
| 2005/0246606 A1 | 11/2005 | Cameron et al. | |
| 2007/0162811 A1 * | 7/2007 | Matsumoto | 714/749 |
| 2007/0260944 A1 | 11/2007 | Cameron et al. | |
| 2007/0283221 A1 * | 12/2007 | Kyung et al. | 714/758 |
| 2008/0037676 A1 * | 2/2008 | Kyung et al. | 375/265 |
| 2008/0301518 A1 * | 12/2008 | Miyazaki | 714/752 |
| 2009/0077453 A1 | 3/2009 | Jones, Jr. | |

* cited by examiner

*Primary Examiner* — April Y Blair
*Assistant Examiner* — Dipakkumar Gandhi
(74) *Attorney, Agent, or Firm* — The Farrell Law Firm, P.C.

(57) ABSTRACT

A method and apparatus for transmitting in a communication/broadcasting system is provided. The method includes determining to use an additional parity technique, generating an Nth parity check matrix, where N is an integer, performing Low Density Parity Check (LDPC) encoding using the Nth parity-check matrix, modulating a codeword corresponding to the Nth parity-check matrix, and transmitting the modulated codeword.

14 Claims, 8 Drawing Sheets

FIG.2

METHOD AND APPARATUS FOR TRANSMITTING AND RECEIVING IN A COMMUNICATION/BROADCASTING SYSTEM

PRIORITY

This application claims priority under 35 U.S.C. §119(a) to Korean Patent Application Serial No. 10-2011-0018740, which was filed in the Korean Intellectual Property Office on Mar. 3, 2011, the entire disclosure of which is hereby incorporated by reference.

BACKGROUND OF THE INVENTION

1. Field of the Invention

The present invention relates generally to a communication/broadcasting system that utilizes a linear code based on a parity-check matrix, and more particularly, to a method and apparatus for efficiently generating additional parity for performance optimization in a communication/broadcasting system.

2. Description of the Related Art

A communication/broadcasting system performs channel coding in order to correct an error occurring in a channel. Although there are a number of different channel coding methods, these methods can be basically divided into methods using a block code, a convolutional code, and a concatenation code, which concatenates a block code and a convolutional code.

The block code was developed based on an error correction theory and includes a simple linear cyclic code, a Bose, Chaudhuri, Hocquenghem (BCH) code, a Reed-Solomon (RS) code, etc.

For the convolutional code, there is a traditional convolutional code and a turbo code that is a modification of the traditional convolutional code. However, there is also a turbo code that is a modification of the traditional block code. Therefore, to distinguish between these two codes, the turbo code based on the convolutional code is called a Convolutional Turbo Code (CTC), and the turbo code based on the block code is called a Block Turbo Code (BTC).

Further, there is a Low Density Parity Check (LDPC) code.

Among these codes, the turbo code and the LDPC code, which are also called repetition codes, are Error Correction Codes (ECC) providing possible error correction closely approaching Shannon's channel capacity limit.

Presently, the LDPC code approaching Shannon's channel capacity limit has been presented in a broadcasting/communication system.

However, next-generation communication/broadcasting systems will require the use of a transmission method capable of maximizing a capacity of an entire system and also meeting demands of various users. Consequently, the use of codes having various code rates and codeword lengths will be required.

Accordingly, a need exists for a method and apparatus for efficiently supporting multiple code rates or multiple codewords in a communication/broadcasting system.

SUMMARY OF THE INVENTION

An aspect of the present invention is to substantially solve at least the above-described problems and/or disadvantages and to provide at least the advantages below.

Accordingly, an aspect of the present invention is to provide a method and apparatus for transmitting and receiving in a communication/broadcasting system.

Another aspect of the present invention is to provide an efficient channel encoding/decoding method and apparatus that support various code rates and various codeword lengths in a communication/broadcasting system.

In accordance with an aspect of the present invention, a transmission method of a transmitter in a communication and broadcasting system is provided. The method includes determining to use an additional parity technique, generating an Nth parity check matrix, where N is an integer, performing Low Density Parity Check (LDPC) encoding using the Nth parity-check matrix, modulating a codeword corresponding to the Nth parity-check matrix, and transmitting the modulated codeword.

In accordance with another aspect of the present invention, a reception method of a receiver in a communication and broadcasting system is provided. The method includes receiving a codeword, performing Low Density Parity Check (LDPC) decoding for the codeword using an Nth parity-check matrix, where N is an integer, detecting an error in the LDPC decoding, and performing LDPC decoding for the codeword using an (N+1)th parity-check matrix.

In accordance with another aspect of the present invention, an apparatus of a transmitter in a communication and broadcasting system is provided. The apparatus includes a controller for determining to use an additional parity technique; a parity-check matrix provider for providing an Nth parity check matrix, where N is an integer; a Low Density Parity Check (LDPC) encoder for performing LDPC encoding using the Nth parity-check matrix; and a transmitter for modulating a codeword corresponding to the Nth parity-check matrix, and transmitting the modulated codeword.

In accordance with another aspect of the present invention, an apparatus of a receiver in a communication and broadcasting system is provided. The apparatus includes a receiving unit for receiving a codeword; a parity-check matrix provider for providing a 2nd parity-check matrix that is an extension of a 1st parity-check matrix using additional parity bits, when there is an LDPC decoding error for the codeword; and a Low Density Parity Check (LDPC) decoder for performing LDPC decoding for the codeword using the 1st parity-check matrix or performing LDPC decoding for the codeword using the 2nd parity-check matrix.

BRIEF DESCRIPTION OF THE DRAWINGS

The above and other aspects, features, and advantages of the present invention will become more apparent from the following detailed description when taken in conjunction with the accompanying drawings in which:

FIG. 2 illustrates a parity-check matrix of $N_1=30$, $K_1=15$, $M_1=5$, $q_1=1$ according to an embodiment of the present invention;

DETAILED DESCRIPTION OF EMBODIMENTS OF THE INVENTION

Figure 1:
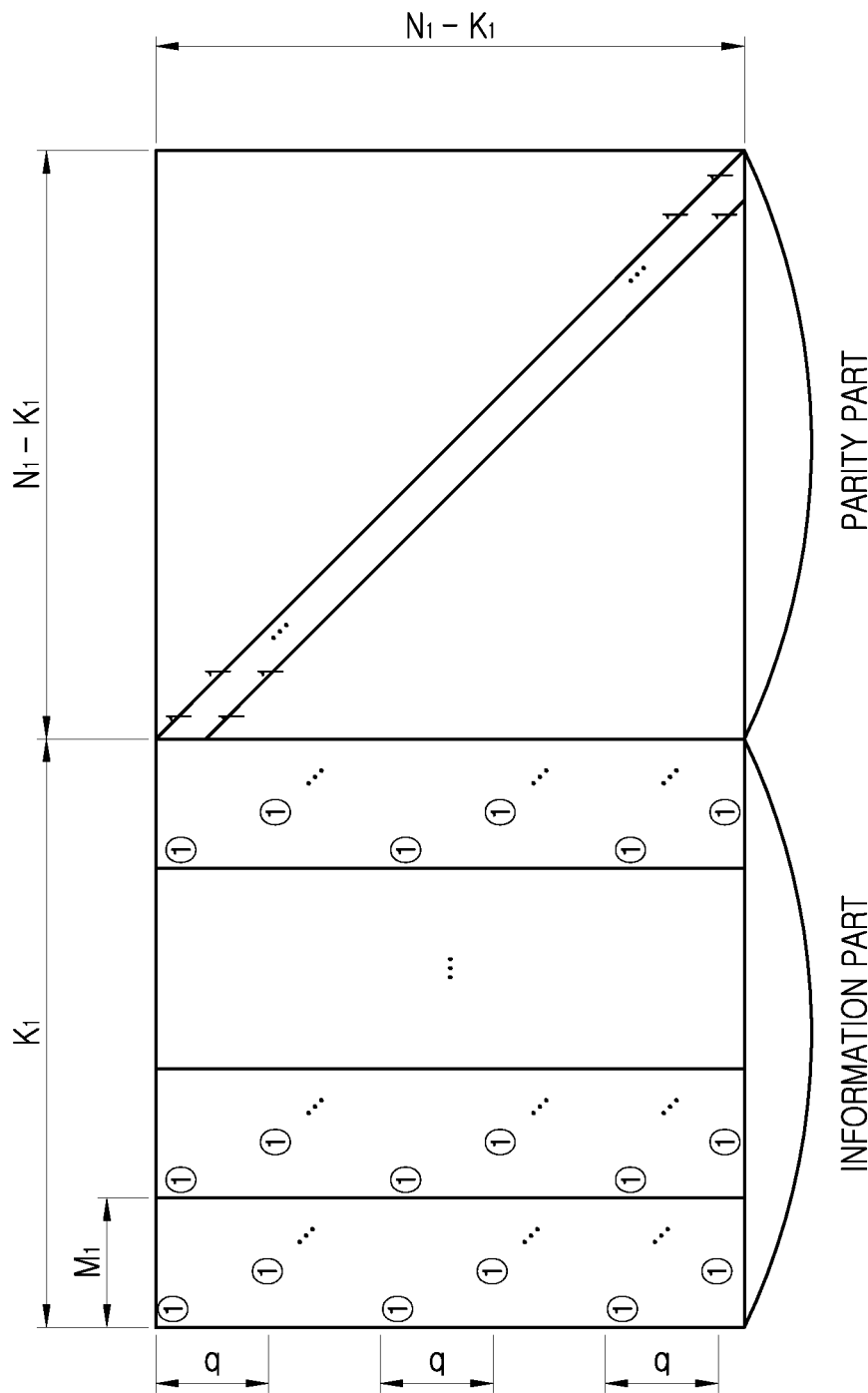
FIG. 1 illustrates a parity-check matrix according to an embodiment of the present invention.

Various embodiments of the present invention will be described herein below with reference to the accompanying drawings. In the following description, well-known functions or constructions are not described in detail to avoid obscuring the invention in unnecessary detail. Further, terms described below, which are defined considering functions in the present invention, can be different depending on user and operator intention or practice. Therefore, the terms should be defined on the basis of the disclosure throughout this specification.

Generally, if the flexibility of a code is high, the code can facilitate an Adaptive Modulation and Coding (AMC) technique or a Hybrid Automatic Retransmission reQuest (HARQ) technique, and support various code rates and codeword lengths using one COder and DECoder (CODEC), reducing hardware complexity.

In a parity-check matrix 'H' or a generation matrix 'G' of a parity-check code, when an information word of a length 'K', i.e., composed of 'K' bits, is 'm=$(m_0, m_1, \ldots, m_{K-1})$', the information word satisfies the relationship in m·G=c, H·$c^T$=0. Here, 'c' denotes a codeword acquired from the message 'm'.

Also, when a codeword of a given linear code is a systematic code, the codeword 'c' is expressed as 'c=(m,p)'. Here, 'p' denotes parity.

Generally, assuming that a message length (i.e., an information word length) is 'K' and a codeword length is 'N', a parity length is '(N−K)' and, for full rank, the size of the parity-check matrix 'H' is '(N−K)×N'.

As an example of a systematic code, parity-check matrix 'H' as shown Equation (1) below is provided.

$$H = \begin{bmatrix} 1 & 1 & 1 & 0 & 1 & 0 & 0 \\ 1 & 1 & 0 & 1 & 0 & 1 & 0 \\ 1 & 0 & 1 & 1 & 0 & 0 & 1 \end{bmatrix} \quad (1)$$

Here, a codeword (c) corresponding to the parity-check matrix 'H' is constructed as 'c=(m,p)' from an information word 'm=$(m_0, m_1, m_2, m_3)$' composed of four information bits and parity 'p=$(p_0, p_1, p_2)$' composed of three parity bits. The codeword (c) is defined in Equation (2) below.

$$H \cdot \underline{c}^T = \begin{bmatrix} 1 & 1 & 1 & 0 & 1 & 0 & 0 \\ 1 & 1 & 0 & 1 & 0 & 1 & 0 \\ 1 & 0 & 1 & 1 & 0 & 0 & 1 \end{bmatrix} \begin{bmatrix} m_0 \\ m_1 \\ m_2 \\ m_3 \\ p_0 \\ p_1 \\ p_2 \end{bmatrix} = \underline{0} \quad (2)$$

By arranging Equation (2) as shown in Equation (3) below, each row of the parity-check matrix 'H' represents one algebraic relational equation. Each relational equation is called a parity-check equation.

$$\begin{bmatrix} m_0 + m_1 + m_2 + p_0 \\ m_0 + m_1 + m_3 + p_1 \\ m_0 + m_2 + m_3 + p_2 \end{bmatrix} = \begin{bmatrix} 0 \\ 0 \\ 0 \end{bmatrix} \quad (3)$$

An element not being '0' in the parity-check matrix is called a weight. In a parity-check code, as the number of weights increases, encoding and decoding complexity increases. That is, in the entire parity-check matrix, as a weight rate decreases, the complexity decreases. Generally, a parity-check code having a very low weight rate is an LDPC code and, in most cases, the LDPC code has a characteristic in which, as a codeword length increases, a weight density decreases.

The parity-check code can be defined differently according to the requirements of a communication and broadcasting system.

FIG. 1 illustrates an example of a parity-check matrix according to an embodiment of the present invention.

Referring to FIG. 1, '$N_1$' and '$K_1$' denote a codeword length of a parity-check code and an information word length, respectively, and '$(N_1-K_1)$' denotes a parity length. In the parity-check matrix, a partial matrix associated with parity, i.e., a structure of $K_1$ th column to $(N_1-1)$ th column is of a dual-diagonal form.

Accordingly, the number of weights of columns corresponding to the partial matrix associated with the parity is '2', except for the last column, which is '1'.

A partial matrix associated with an information word, i.e., a 0th column to a $(K_1-1)$th column, includes columns that are grouped in units of '$M_1$' columns. Here, '$M_1$' is a parameter of the parity-check matrix of FIG. 1, and '$M_1$' can change a value according to a given communication/broadcasting system.

In the partial matrix associated with the information word, if a position of a row in which a weight exists in a 0th column within each column group is determined, a position of a row in which a weight exists at in ith column within each column group is cyclically shifted as much as '$i \cdot q_1 \mod(N_1-K_1)$' from the position of the row in which the weight exists in the 0th column within each column group. Here, the '$q_1$' is an integer, and is set to meet '$q_1=(N_1-K_1)/M_1$'.

Figure 2:
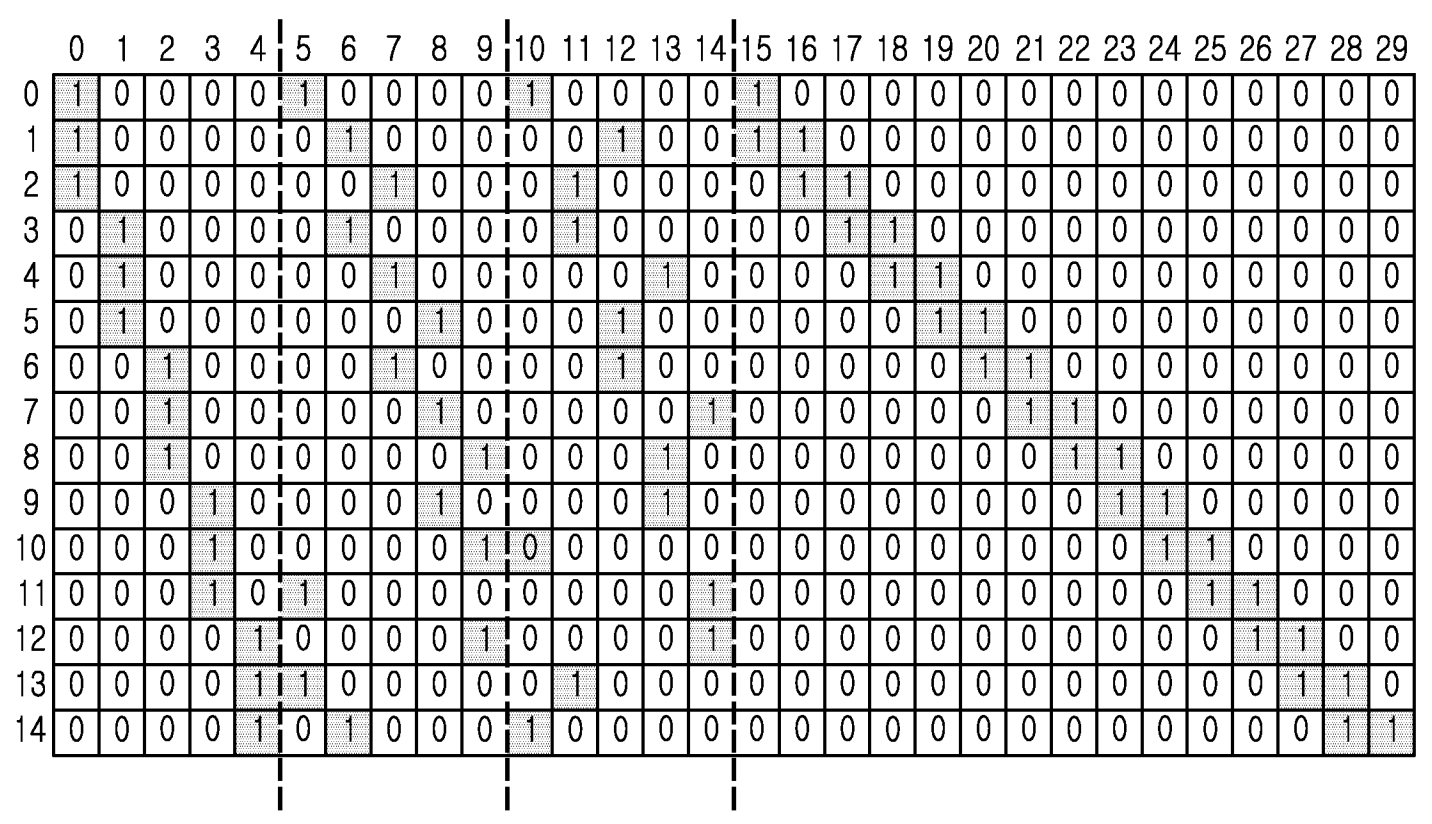

For example, a parity-check matrix as illustrated in FIG. 1, having $N_1$=30, $K_1$=15, $M_1$=5, $q_1$=1 and expressing position information of a row having a weight-1 for each of 0th columns of three column groups as in Table 1 below, is illustrated in FIG. 2.

TABLE 1

| 0 | 1  | 2  |
|---|----|----|
| 0 | 11 | 13 |
| 0 | 10 | 14 |

Here, the sequence is called a weight-1 position sequence for convenience. A jth sequence (j=0, 1, ..., $(K_1/M_1-1)$) in the weight-1 position sequence is a sequential expression of position information of a row in which a weight-1 is positioned at a 0th column within a jth column group in the weight-1 position sequence.

FIG. 2 illustrates a parity-check matrix of $N_1$=30, $K_1$=15, $M_1$=5, $q_1$=1 according to an embodiment of the present invention.

Referring to FIG. 2, in the first column group composed of a 0th column to a 4th column, weight-1s are positioned in the 0th column, which corresponds to the first column within the first column group, in rows 0, 1, and 2. Further, weight-1s are positioned in the 1st column, which corresponds to the second column within the first column group, in rows 3, 4, and 5, where 3 $(=(0+q_1)\mod(N_1-K_1))$, 4 $(=(1+q_1)\mod(N_1-K_1))$, and 5 $(=(2+q_1)\mod(N_1-K_1))$. Additionally, weight-1s are positioned in the 3rd column, which corresponds to the fourth column within the first column group, in rows 9, 10, and 11, where 9 $(=(0+3\times q_1)\mod(N_1-K_1))$, 10 $(=(1+3\times q_1)\mod(N_1-K_1))$, and 11 $(=(2+3\times q_1)\mod(N_1-K_1))$.

In the second column group, i.e., the 5th column to the 9th column, weight-1s are positioned at the 5th column, which corresponds to the first column within the second column group, in rows 0, 11, and 13. Weight-1s are positioned in the 6th column, which corresponds to the second column within the second column group, in rows 1, 3, and 14, where 1 $(=(13+q_1)\mod(N_1-K_1))$, 3 $(=(0+q_1)\mod(N_1-K_1))$, and 14 $(=(11+q_1)\mod(N_1-K_1))$. Weight-1s are positioned in the 9th column, which corresponds to the fifth column within the second column group, in rows 8, 10, and 12, where 8 $(=(11+4\times q_1)\mod(N_1-K_1))$, 10 $(=(13+4\times q_1)\mod(N_1-K_1))$, and 12 $(=(0+4\times q_1)\mod(N_1-K_1))$.

Likewise, this feature can be easily identified in the other column groups.

The parity-check matrix of FIG. 1 can be uniquely defined by $N_1$, $K_1$ and $M_1$ values and weight-1 position sequences. Therefore, for convenience, the parity-check matrix illustrated in FIG. 1 is simply expressed by $N_1$, $K_1$, and $M_1$ weight-1 position sequences corresponding to the parity-check matrix.

Assuming that a codeword of the parity-check code associated with the parity-check matrix 'H' of Equation (1) is expressed as 'c=$(m_0,m_1,m_2,m_3,p_0,p_1,p_2)$' and the 'c' is transmitted to a receiving end in a communication/broadcasting system using the parity-check code, the receiving end may fail to decode an information word 'm' from a received signal. In this case, a transmit end transmits additional parity, and the receive end receives the additional parity, performs combination with the code, and again performs decoding to restore the information word 'm'.

In accordance with an embodiment of the present invention, a method is provided for identifying hidden intermediate variables from a given parity-check matrix and a previously transmitted codeword, and then utilizing the intermediate values as additional parity in a communication/broadcasting system. For this, three parity-check equations, i.e., Equations (i), (ii), and (iii), as expressed in Equation (4) below, are provided.

$$m_0+m_1+m_2+p_0=0 \quad (i)$$

$$m_0+m_1+m_3+p_1=0 \quad (ii)$$

$$m_0+m_2+m_3+p_2=0 \quad (iii) \qquad (4)$$

In Equation (4), Equation ( ) is equivalent to '$m_0+p_0=m_1+m_2$', Equation (ii) is equivalent to '$m_0+m_3=m_1+p_1$'. Therefore, Equations (i) and (ii) can be expressed as shown in Equation (5) below, introducing intermediate variables ($y_0$, $y_1$).

$$\begin{aligned} y_0 &= m_0 + p_0 = m_1 + m_2 = 0 \\ y_1 &= m_0 + m_3 = m_1 + p_1 = 0 \end{aligned} \Leftrightarrow \begin{cases} y_0 = m_0 + p_0 \\ y_0 = m_1 + m_2 \\ y_1 = m_0 + m_3 \\ y_1 = m_1 + p_1 \end{cases} \qquad (5)$$

Equation (6) below provides Equations (4) and (5) expressed as parity-check equations regarding each of the intermediate variables ($y_0$, $y_1$) as a parity bit.

$$\begin{bmatrix} m_0 + p_0 + y_0 \\ m_1 + m_2 + y_0 \\ m_1 + p_1 + y_1 \\ m_0 + m_3 + y_1 \\ m_0 + m_2 + m_3 + p_2 \end{bmatrix} = \begin{bmatrix} 0 \\ 0 \\ 0 \\ 0 \\ 0 \end{bmatrix} \qquad (6)$$

In Equation (6) above, there is no change of values of '$m_0$, $m_1$, $m_2$, $m_3$, $p_0$, $p_1$, $p_2$' despite the introduction of the intermediate variables ($y_0$, $y_1$). Also, Equation (6) can be expressed in a form of a multiplication of a matrix as shown in Equation (7) below.

$$0 = \begin{bmatrix} 1 & 0 & 0 & 0 & 1 & 0 & 0 & 1 & 0 \\ 0 & 1 & 1 & 0 & 0 & 0 & 0 & 1 & 0 \\ 0 & 1 & 0 & 0 & 0 & 1 & 0 & 0 & 1 \\ 1 & 0 & 0 & 1 & 0 & 0 & 0 & 0 & 1 \\ 1 & 0 & 1 & 1 & 0 & 0 & 1 & 0 & 0 \end{bmatrix} \begin{bmatrix} m_0 \\ m_1 \\ m_2 \\ m_3 \\ p_0 \\ p_1 \\ p_2 \\ y_0 \\ y_1 \end{bmatrix} = H_E \cdot c_E^T \qquad (7)$$

In Equation (7), '$c_E$' represents a codeword composed of 'c' and '$y_0$, $y_1$'. Here, a parity-check matrix for the codeword '$c_E$' is '$H_E$'. That is, it is the same as generating an extended codeword '$c_E=(c, y_0, y_1)$' in which parity ($y_0$, $y_1$) are additionally added to the firstly given codeword 'c'.

Here, in the relationship between the 'H' of Equation (1) and the '$H_E$' of Equation (7), the first row of the 'H' is determined by combining the first and second rows of the '$H_E$', and the second row of the 'H' is determined by combining the third and fourth rows of the '$H_E$'.

If rows of the parity-check matrix '$H_E$' determined through the introduction of the intermediate variables as above are suitably added to each other, the firstly given parity-check matrix 'H' can be determined as desired.

When a communication/broadcasting system uses a parity-check code for encoding/decoding, and suitable intermediate variables are introduced into a parity-check matrix of the parity-check code as in Equations (4) and (5) above, the communication/broadcasting system can determine an extended parity-check matrix like '$H_E$' in Equation (7) and the introduced intermediate variables can be regarded as newly generated parity bits. Accordingly, when the communication/broadcasting system requires transmission of additional parity, the communication/broadcasting system can transmit values corresponding to the intermediate variables and perform efficient encoding/decoding.

Commonly, when a communication/broadcasting system uses additional parity, the communication/broadcasting system cannot determine an additional coding gain until generating new additional parity different from previously generated parity, rather than simply repeatedly transmitting parity. However, in accordance with an embodiment of the present invention, the communication/broadcasting system can achieve additional coding gain by generating the additional parity using Equations (4) and (5), as described above.

Generally, when a communication/broadcasting system separates each of 'A' parity-check equations into two parity-check equations and determines '2A' parity-check equations in a parity-check matrix, the communication/broadcasting system can draw 'A' intermediate variables.

For example, as shown in Equations (4), (5), and (7), when the communication/broadcasting system separates each of two parity-check equations matching with two rows into two parity-check equations in a given parity-check matrix, the total two intermediate variables are drawn.

Additionally, each time one parity-check equation is separated into 'B' parity-check equations, the communication/broadcasting system can draw '(B−1)' intermediate variables.

Generally, when each of 'A' parity-check equations is separated into 'B' parity-check equations and 'A·B' parity-check equations are determined, the communication/broadcasting system can draw a total of 'A·(B−1)' intermediate variables.

Although an embodiment of the present invention wherein a parity-check equation is separated into two parity-check equations, i.e., where 'B=2', the value of 'B' is not limited thereto. That is, the parity-check equation may be separated into a different number of parity-check equations.

In accordance with an embodiment of the present invention, a method is provided, which uses additional parity through a hidden intermediate variable determined using Equations (4) and (5) according to a specific rule in a parity-check matrix as illustrated in FIG. 1 for an LDPC code having the parity-check matrix of FIG. 1. Further, an efficient encoding method for the LDPC code is provided.

First, an example of an encoding method for an LDPC code having the parity-check matrix of FIG. 1 is provided. Here, the parity-check matrix is '$H_1$', a partial matrix associated with an information word part is '$H_{1,I}$', and a partial matrix associated with parity is '$H_{1,P}$'. That is, $H_1 = [H_{1,I} \, H_{1,P}]$. Also, a codeword '$c_1$' is given as '$c_1 = (m, p_1)$' using a message 'm' and parity '$p_1$'.

The codeword '$c_1$' should meet '$H_1 \cdot c_1^T = 0$' and therefore, can be arranged as shown in Equation (8) below.

$$\underline{0} = [H_{1,I} \ H_{1,P}] \cdot \begin{bmatrix} \underline{m} \\ \underline{p_1} \end{bmatrix} \Rightarrow H_{1,I}\underline{m}^T = H_{1,P}\underline{p_1}^T \quad (8)$$

Accordingly, the encoding process of the LDPC code is the same as generating the parity '$p_1$' of Equation (8).

As an example of this encoding process, a method for generating the parity '$p_1$' associated with the parity-check matrix '$H_1$' of FIG. 1 is as follows.

Example of Encoding Method

Step 1) Initializing to get $p_1 = (p_{1,0}, p_{1,1}, \ldots, p_{1,(N_1-K_1-1)}) = 0$
$(p_{1,0}, p_{1,1}, \ldots, p_{1,(N_1-K_1-1)}) = 0)$ Step 2) Storing to get $p_1 = H_{1,I} m^T$ Step 3) Sequentially taking $p_{1,i} \leftarrow p_{1,i} \oplus p_{1,j-1}$ for i=1, 2, ..., ($N_1-K_1-1$). Here, the '$\oplus$' is an eXclusive OR(XOR) operation.

A method for determining an extended parity-check matrix by introducing suitable intermediate variables as in Equations (4) and (5) for the parity-check matrix '$H_1$' is defined as follows. Here, a first given parity-check matrix is called a 1st parity-check matrix, and its corresponding weight-1 position sequence is called a 1st weight-1 position sequence.

Method for Determining Extended Parity-Check Matrix

A position $(a_0, a_1, a_2, \ldots, a_{F_{IR}-1})$ of a row corresponding to a parity-check equation to be separated in a parity-check matrix corresponding to a 1st weight-1 sequence is determined, where each $a_1$ value satisfies the relationship of $0 \le a_0 \le a_1 \le \ldots \le a_{F_{IR}-1} < q_1$.

For i=0, 1, ..., ($F_{IR}-1$), j=0, 1, ..., ($M_1-1$), all parity check equations corresponding to a $a_{i+j \cdot q_1}$ th row are separated by applying hidden intermediate variables determined using Equations (4) and (5).

The parity-check matrix determined through parity check Equation (ii) above is called a 2nd parity check matrix, and its corresponding weight-1 position sequence is called a 2nd weight-1 position sequence.

Figure 3:
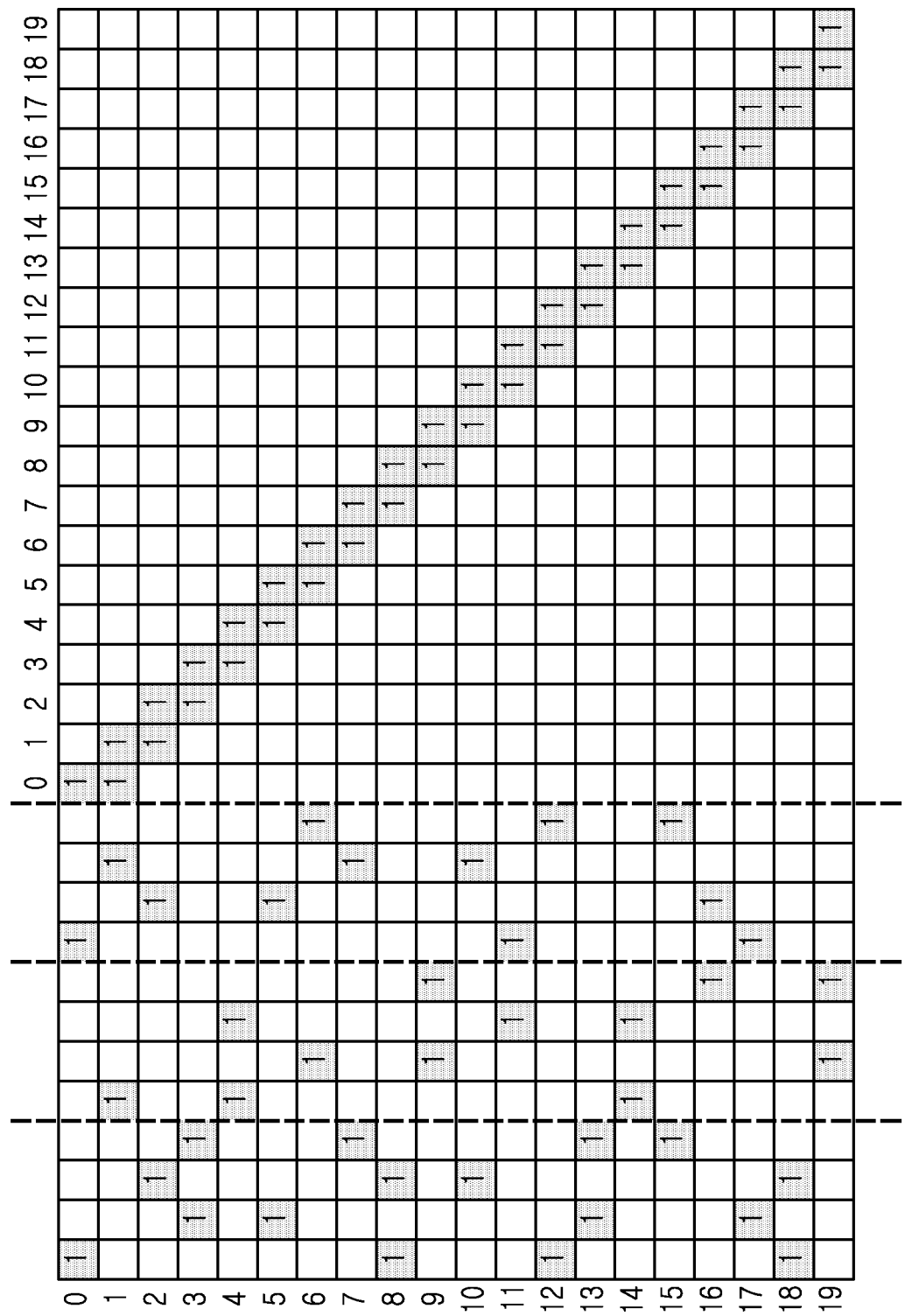
FIG. 3 illustrates a parity-check matrix having a 1st weight-1 sequence of $N_1=32$, $K_1=12$, $M_1=4$, $q_1=5$ according to an embodiment of the present invention.

FIG. 3 illustrates a parity-check matrix having a 1st weight-1 sequence of $N_1=32$, $K_1=12$, $M_1=4$, $q_1=5$ according to an embodiment of the present invention.

Referring to FIG. 3, a parity-check matrix '$H_1$' being $N_1=32$, $K_1=12$, $M_1=4$, $q_1=5$ and having a 1st weight-1 sequence shown in Table 2 is provided.

TABLE 2

| 0 | 8  | 12 | 18 |
|---|----|----|----|
| 1 | 4  | 14 |    |
| 0 | 11 | 17 |    |

Figure 4:
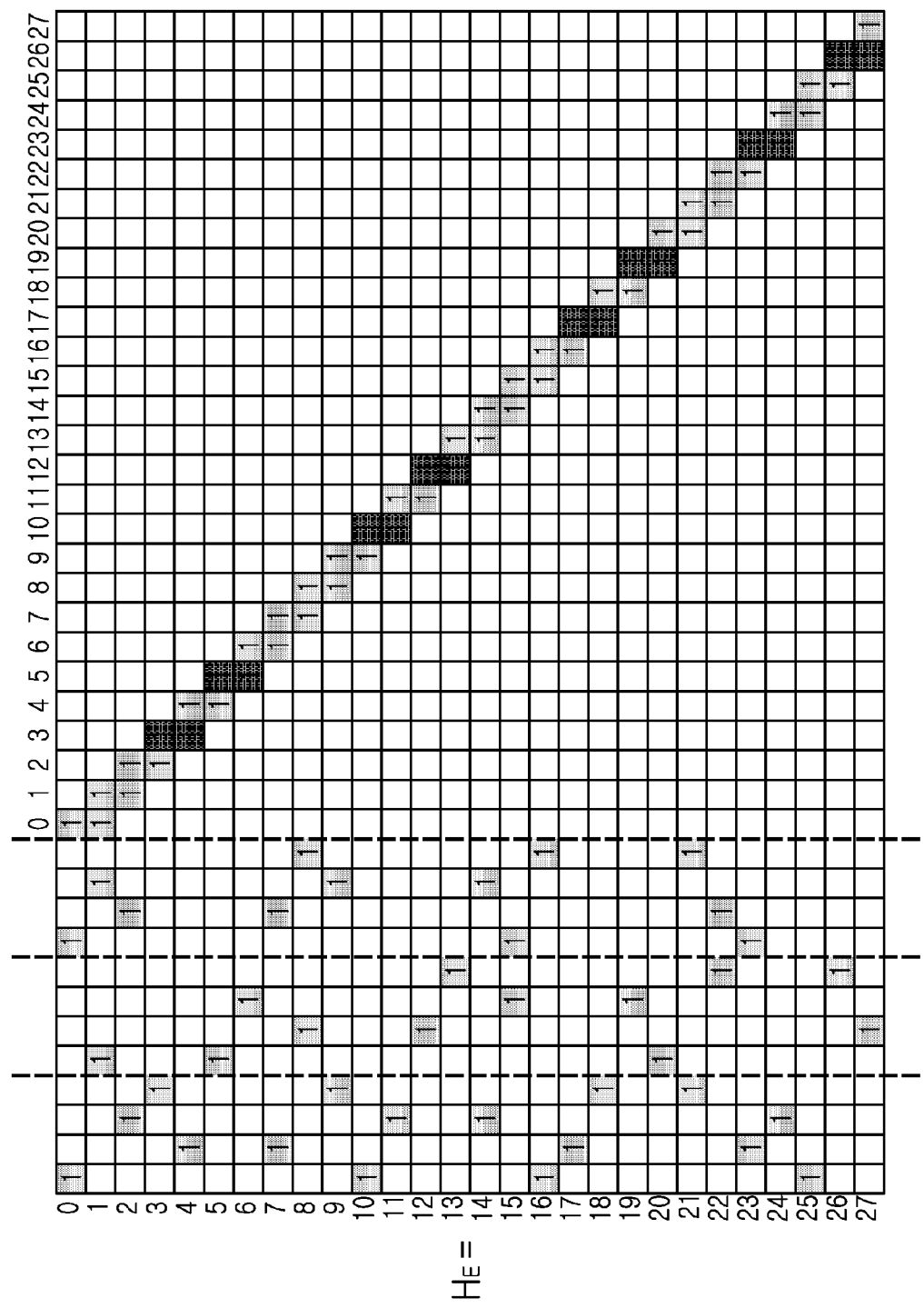
FIG. 4 illustrates an extended parity-check matrix according to an embodiment of the present invention.

Assuming that $F_{IR}=2$ and $a_0=3$, $a_1=4$ are previously determined, a parity-check matrix as illustrated in FIG. 4 can be determined.

FIG. 4 illustrates an extended parity-check matrix according to an embodiment of the present invention.

Referring to FIG. 4, the extended parity-check matrix of FIG. 4 can be determined by separating parity check equations corresponding to a (3+5i)th row and a (4+5i)th row for i=0, 1, 2, 3 from the parity-check matrix illustrated in FIG. 3.

A 2nd weight-1 position sequence is given in Table 3 below.

TABLE 3

| 0 | 10 | 16 | 25 |
|---|----|----|----|
| 1 | 5  | 20 |    |
| 0 | 15 | 23 |    |

Assuming parity '$p = (p_0, p_1, \ldots, p_{19})$' corresponding to the 1st parity-check matrix '$H_1$' of FIG. 3 and parity $p_E = (p_{E,0}, p_{E,1}, \ldots, p_{E,27})$ corresponding to the 2nd parity-check matrix '$H_E$' of FIG. 4, the following relationship is established.

Regarding i=0, 1, 2, 3, $p_{E,(0+7i)} = p_{0+5i}$, $p_{E,(1+7i)} = p_{1+5i}$, $p_{E,(2+7i)} = p_{2+5i}$, $p_{E,(4+7i)} = p_{3+5i}$, $p_{E,(6+7i)} = p_{4+5i}$ are established, and $p_{E,(3+7i)}$ and $p_{E,(5+7i)}$ are newly generated parity. Here, the number of newly generated parity bits is equal to 8 bits from '$2 \times 4 (= F_{IR} \times M_1 = N_{IR})$'.

Here, it is assumed that there is a need to transmit additional parity bits of the 8 bits, after applying the Example of Encoding Method based on the 1st parity-check matrix illustrated in FIG. 3, generating a codeword, and transmitting the codeword to a receiver.

To generate the 8 additional parity bits, a codeword is generated by applying the Example of Encoding Method based on the 2nd parity-check matrix illustrated in FIG. 4.

Thereafter, if only the newly generated parity bits not corresponding to the codeword generated based on the 1st parity-check matrix are selectively transmitted, that is, if only the newly generated parity are transmitted, the receiver can perform decoding using the codeword generated based on the 1st parity-check matrix and the 8 additional parity bits.

However, because simply twice performing the Example of Encoding Method generates many unnecessary redundant parity bits, resources are wasted and an encoding delay occurs. This phenomenon increases as a code rate of an LDPC code is lowered and as the number of parity bits to additionally generate increases.

Accordingly, the following modified encoding method is provided.

Here, a 1st parity-check matrix is given as $H_1=[H_{1,I} H_{1,P}]$, and key parameters of a code are given as a codeword length '$N_1$', an information word length '$K_1$', a column group unit '$M_1$', '$q_1=(N_1-K_1)/M_1$'. A 2nd parity-check matrix determinable from the 1st parity-check matrix by applying the Method for Determining Extended Parity-Check Matrix is given as $H_E=[H_{E,I} H_{E,P}]$, and key parameters of each code are given as '$N_E=(N_1+N_{IR})$', an information word length '$K_1$', a column group unit '$M_1$', and '$q_E=(N_E-K_1)/M_1$'.

Here, the '$N_{IR}$' indicates the number of parity bits to be newly added and, to guarantee that the '$q_E$' is an integer, '$N_{IR}/M_1=F_{IR}$' (however, $F_{IR} \leq q_1$) is set to be an integer. Also, each codeword is expressed as $c_1=(m, p_1)=(m, p_{1,0}, p_{1,1}, \ldots, p_{1,(N_1-K_1-1)})$, and $c_E=(m, p_E)=(m, p_{E,0}, p_{E,1}, \ldots, p_{E,(N_1-K_1-1)})$.

Modified Encoding Method

---

Step 1) Initializing to get $p_{E,0} = p_{E,1} = \ldots = p_{E,(N1-K_1-1)} = 0$
Step 2) Storing to get $\underline{p_E} = H_{E,I} \underline{m}^T$
Step 3)
  Temp = 0;
  For $0 \leq i < M_I$
    For $0 \leq j < q_E$
      $p_{E,(i \cdot q_E+j+1)} \leftarrow p_{E,(i \cdot q_E+j+1)} \oplus p_{E,(i \cdot q_E+j)}$
      For $0 \leq k < F_{IR}$
        If $((i \cdot q_E + j) \neq (i \cdot q_E + a_k + 1))$
          $p_{1,i \cdot q_E+j-Temp} = p_{E,i \cdot q_E+j}$
        Else
          Temp ← (Temp + 1)
      End
    End
  End

---

The Modified Encoding Method can generate '$c_1$' and '$c_E$' simultaneously.

Accordingly, when a transmitting end generates and transmits additional parity bits, after transmitting '$c_1$', it is sufficient for the transmitting to additionally transmit only '$p_{E,a_1+j \cdot q_E}$' for i=0, 1, ..., $(F_{IR}-1)$, j=0, 1, ..., $(M_1-1)$ in '$c_E$', without having to again generate the whole '$c_E$'.

Generally, when a system does not apply an additional parity technique, the Example of Encoding Method is efficient and, when the system applies the additional parity technique, the Modified Encoding Method is efficient. Therefore, it is desirable to determine the encoding method according to whether or not the additional parity technique is applied.

Figure 5:
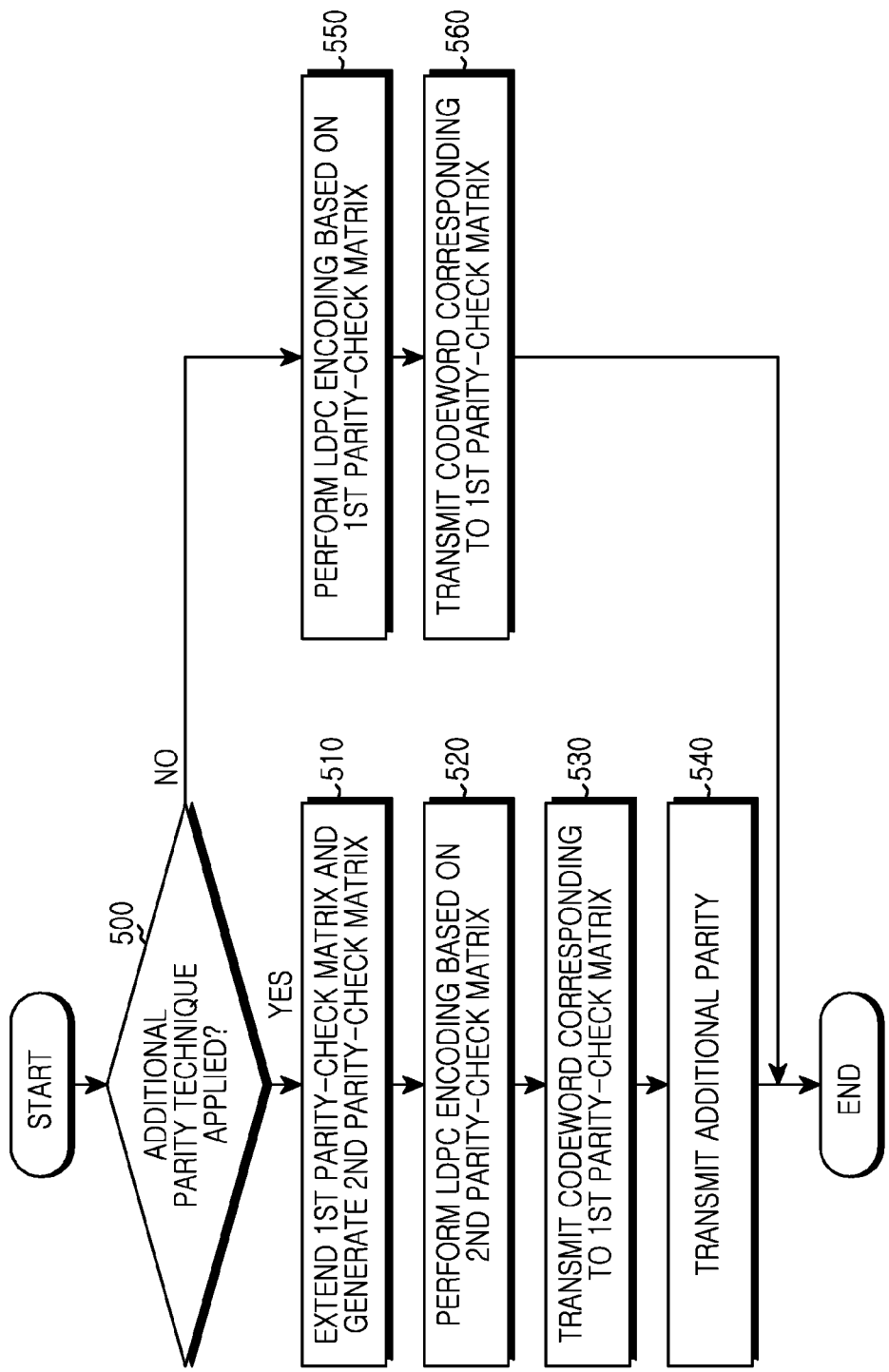
FIG. 5 is a flowchart illustrating a channel encoding method in a communication/broadcasting system using an LDPC code according to an embodiment of the present invention.

FIG. 5 is a flowchart illustrating a channel encoding method in a communication/broadcasting system using an LDPC code according to an embodiment of the present invention.

Referring to FIG. 5, in step 500, a transmitter determines whether to apply an additional parity technique. Here, the determination criterion can be different according to a realization situation or channel state, or can be previously set.

When applying the additional parity technique, in step 510, the transmitter generates a 2nd parity-check matrix from a 1st parity-check matrix.

Step 510 may be repeatedly performed several times. For example, the transmitter can generate a 3rd parity-check matrix using a 2nd parity-check matrix and, likewise, can generate an Nth parity-check matrix using an (N−1)th parity-check matrix. Further, if the transmitter has already stored the 2nd, 3rd, ..., Nth parity-check matrixes using a memory, step 510 may be omitted.

In step 520, the transmitter performs encoding using the generated 2nd parity-check matrix. When the transmitter has generated the Nth parity-check matrix as above, it is also possible to perform encoding using the Nth parity-check matrix.

In step 530, the transmitter modulates and transmits a codeword corresponding to the 1st parity-check matrix. If the transmitter generates the Nth parity-check matrix in step 510, the transmitter may separately transmit each of additional parity bits generated sequentially up to the Nth parity-check matrix.

As described above, the transmitter may separately transmit the additional parity bits in time, but may also separately transmit in space or in frequency. For example, in step 540, the transmitter may separately transmit the additional parity bits through a different frame or a different region of a specific transmission duration transmitted at an equal time, or may transmit through a different frequency band.

If it is determined in step 500 that the transmitter will not apply the additional parity technique, in step 550, the transmitter performs encoding using the 1st parity-check matrix. In step 560, the transmitter then modulates and transmits a codeword corresponding to the 1st parity-check matrix.

Figure 6:
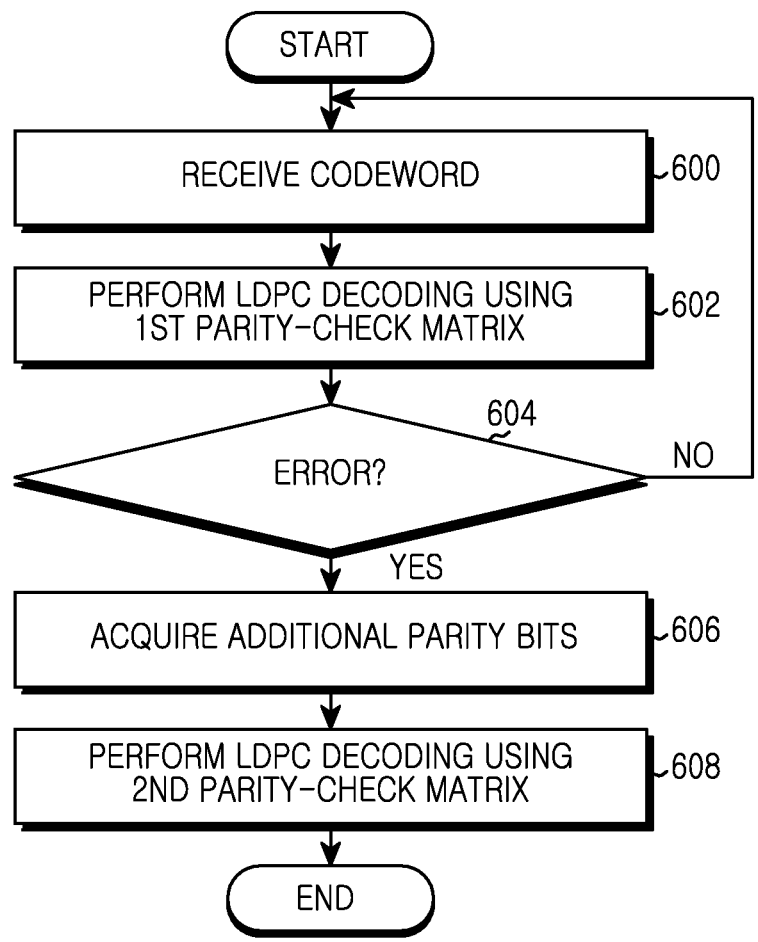
FIG. 6 is a flowchart illustrating a channel decoding method in a communication/broadcasting system using an LDPC code according to an embodiment of the present invention.

FIG. 6 is a flowchart illustrating a channel decoding method in a communication/broadcasting system using an LDPC code according to an embodiment of the present invention.

Referring to FIG. 6, in step 600, a receiver receives an encoding information bit and, in step 602, performs LDPC decoding using a 1st parity-check matrix.

If the receiver determines that there is no LDPC decoding error in step 604, the method returns to step 600, such that the receiver can continuously receive an encoding information bit and then re-perform LDPC decoding using the 1st parity-check matrix in step 602.

However, the receiver determines that there is an LDPC decoding error in step 604, in step 606, and the receiver sends a request for transmission of additional parity to a transmitter, receives additional parity bits from the transmitter, and generates a 2nd parity-check matrix using the received additional parity bits.

Alternatively, the receiver may already have stored or generated the 1st parity-check matrix and the 2nd parity-check matrix. In this case, the receiver may then determine additional parity bits using the 1st and 2nd parity-check matrixes stored or generated in the receiver, without requesting and receiving the additional parity bits. Further, irrespective of the request from the receiver, the transmitter may transmit the additional parity bits to the receiver, and the receiver may store the additional parity bits transmitted from the transmitter and use, if there occurs a decoding error, the stored additional parity bits without a separate request.

In step 608, the receiver performs LDPC decoding using the 2nd parity-check matrix, which is an extension of the 1st parity-check matrix.

Although not illustrated separately, when a receiver of excellent decoding performance in which performance is not deteriorated, even when decoding is performed using an extended Nth parity-check matrix, rather than the 1st parity-check matrix, the receiver can omit steps 602, 604, and 606 and just perform the decoding using the Nth parity-check matrix.

The Nth parity-check matrix may be acquired from the transmitter or may be previously stored in the receiver.

In this case, the transmitter suitably encodes and transmits using the Nth parity-check matrix, or the transmitter encodes using a 1st parity-check matrix and, separately or together with encoded data, transmits additional parity bits generated sequentially up to the Nth parity-check matrix.

Also, even when transmitted data or content require high decoding performance as premium data or content, the receiver can omit steps 602, 604, and 606 and just perform decoding using an Nth parity-check matrix. That is, when the transmitter encodes and transmits the data or content as the premium data or content using the Nth parity-check matrix, or when the transmitter performs encoding using a 1st parity-check matrix and transmits, separately or together with encoded data, additional parity bits generated sequentially up to the Nth parity-check matrix, the receiver can omit steps 602, 604, and 606 and just perform the decoding using the Nth parity-check matrix or perform the decoding using the additional parity bits generated sequentially up to the Nth parity-check matrix.

Figure 7:
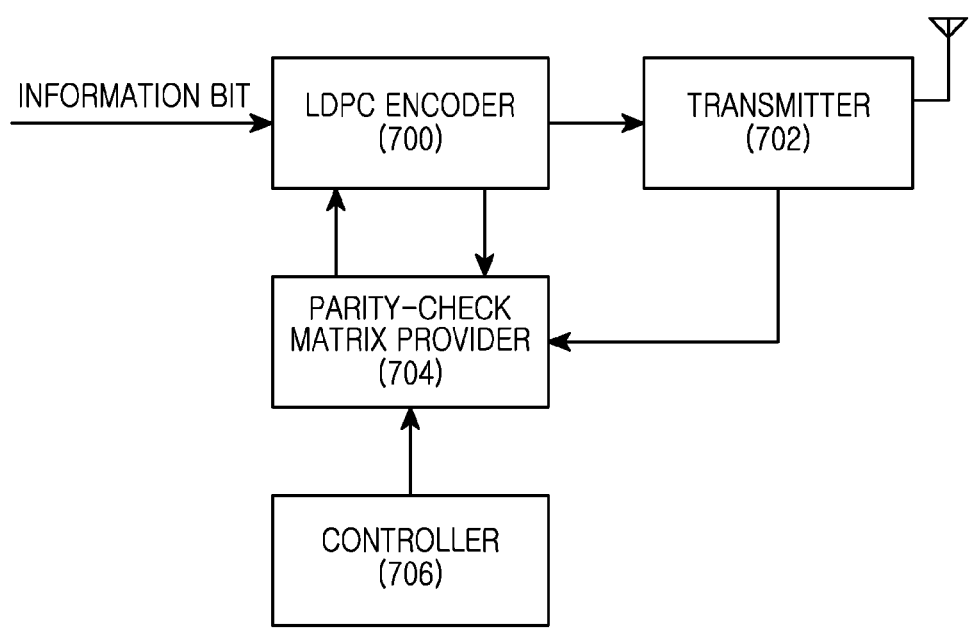
FIG. 7 illustrates a transmitter according to an embodiment of the present invention.

FIG. 7 illustrates a transmitter according to an embodiment of the present invention.

Referring to FIG. 7, the transmitter includes an LDPC encoder 700, a transmitter 702, a parity-check matrix provider 704, and a controller 706. The LDPC encoder 700 performs LDPC encoding using a 1st parity-check matrix or 2nd parity-check matrix provided from the parity-check matrix provider 704. For example, LDPC encoder 700 receives an input information signal 'm=$(m_0, m_1, \ldots, m_{k-1})$', and outputs a codeword 'c' meeting '$H \cdot c^T = 0$' for a parity-check matrix 'H'.

The parity-check matrix provider 704 provides a suitable parity-check matrix to the LDPC encoder 700 according to the determination of the controller 706 as to whether to apply an additional parity technique.

The parity-check matrix provider 704 can either generate a 2nd parity-check matrix through a 1st parity-check matrix or store the 1st and 2nd parity-check matrixes, and provides the 1st parity-check matrix or 2nd parity-check matrix to the LDPC encoder 700 according to the determination of the controller 706.

The parity-check matrix provider 704 can provide additional parity bits generated sequentially up to an Nth parity-check matrix, to the LDPC encoder 700 or the transmitter 702.

When the parity-check matrix provider 704 simultaneously provides the 1st or 2nd parity-check matrix and the generated additional parity bits to the LDPC encoder 700, the LDPC encoder 700 provides the received 1st or 2nd parity-check matrix, a codeword generated through an information bit, and the additional parity bits, to the transmitter 702.

The additional parity bits may be arranged and encoded in a different frame or a different region within the same frame. Although not illustrated, the additional parity bits may be provided directly to the transmitter 702.

The transmitter 702 modulates an encoded bit received from the LDPC encoder 700 and then, frequency-up converts a baseband signal into a Radio Frequency (RF) signal and transmits the RF signal through an antenna.

When the transmitter 702 is provided with additional parity bits from the parity-check matrix provider 704, the transmitter 702 can transmit the additional parity bits through a different frequency band, a different time, or a different frame.

Figure 8:
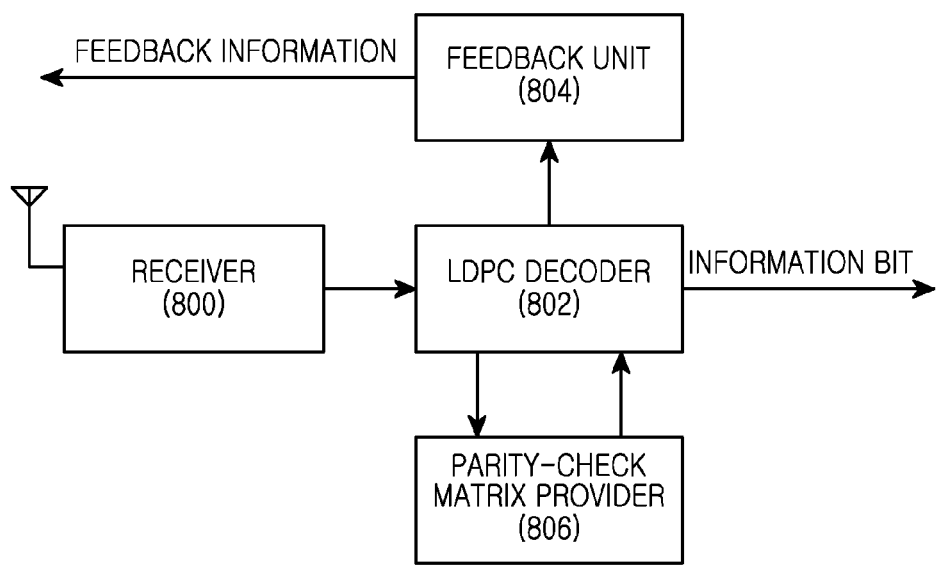
FIG. 8 illustrates a receiver according to an embodiment of the present invention.

FIG. 8 illustrates a receiver according to an embodiment of the present invention.

Referring to FIG. 8, the receiver includes a receiver 800, an LDPC decoder 802, a feedback unit 804, and a parity-check matrix provider 806.

The receiver 800 frequency-down converts a Radio Frequency (RF) signal received through an antenna into a baseband signal and demodulates the baseband signal.

When additional parity bits have been transmitted through a different frequency band, a different time, or a different frame, the receiver 800 can separately separate the additional parity bits and provide the additional parity bits to the LDPC decoder 802.

The LDPC decoder 802 performs decoding associated with encoding performed by the LDPC encoder 700 illustrated in FIG. 7, based on a 1st parity-check matrix or 2nd parity-check matrix provided from the parity-check matrix provider 806.

Also, the LDPC decoder 802 can perform decoding using additional parity bits provided from the receiver 800 or the parity-check matrix provider 806 and a parity-check matrix provided from the parity-check matrix provider 806.

When the LDPC decoder 802 performs the decoding associated with the encoding performed by the LDPC encoder 700, the LDPC decoder 802 informs the decoding result of the feedback unit 804. That is, when an error occurs while decoding, the LDPC decoder 802 provides a Negative ACKnowledgement (NACK) signal to the feedback unit 804 and, when normal processing is performed at the time of decoding, the LDPC decoder 802 provides an ACKnowledgement (ACK) signal to the feedback unit 804.

The feedback unit 804 transmits an ACK/NACK signal to a transmitter. When reverse transmission is impossible, as in many broadcasting standards, the feedback unit 804 may not be an essential element.

The parity-check matrix provider 806 can either generate a 2nd parity-check matrix through a 1st parity-check matrix or store the 1st and 2nd parity-check matrixes, and provides the 1st or 2nd parity-check matrix to the LDPC decoder 802.

The parity-check matrix provider 806 can provide additional parity bits generated sequentially up to an Nth parity-check matrix, to the LDPC decoder 802.

When the parity-check matrix provider 806 simultaneously provides the 1st parity-check matrix or 2nd parity-check matrix and the generated additional parity bits to the LDPC decoder 802, the LDPC decoder 802 performs decoding using the additional parity bits and the parity-check matrix.

When the additional parity bits are arranged and encoded in a different frame or a different region within the same frame, but are not separately provided from the parity-check matrix provider 806, the additional parity bits can be acquired from the receiver 800 or the LDPC decoder 802.

As described above, the various embodiments of the present invention can efficiently support a multiple code rate or a multiple codeword, by modifying a parity-check matrix of a parity-check code or LDPC code and using additional parity-check bits in a communication/broadcasting system using the parity-check code or LDPC code. Consequently, an encoding/decoding complexity is reduced, and a decoding convergence speed increased, thereby improving performance.

While the present invention has been shown and described with reference to certain embodiments thereof, it will be understood by those skilled in the art that various changes in form and details may be made therein without departing from the spirit and scope of the present invention as defined by the appended claims and their equivalents.

What is claimed is:

1. A transmission method of a transmitter in a communication and broadcasting system, the method comprising:
    performing Low Density Parity Check (LDPC) encoding using a second parity-check matrix generated from a first parity-check matrix;
    modulating a codeword corresponding to the first parity-check matrix;
    transmitting the modulated codeword; and
    transmitting additional parity bits, separately from the modulated codeword in time, space, or frequency, among parity bits generated by the second parity-check matrix.

2. The method of claim 1, wherein performing the LDPC encoding comprises:
    receiving an input information signal '$m=(m_0,m_1, \ldots, m_{k-1})$'; and
    outputting a codeword 'c',
    where 'c' satisfies '$H \cdot c^T = 0$' for a parity-check matrix 'H'.

3. The method of claim 1, wherein generating the second parity-check matrix comprises:
    previously storing the first parity-check matrix and the second parity-check matrix; and
    retrieving the second parity-check matrix from the previously stored parity-check matrixes.

4. The method of claim 1, wherein generating the second parity-check matrix comprises:
    selecting at least one parity check equation corresponding to a parity check equation in the first parity-check matrix;
    separating each of the selected at least one parity check equation into at least two parity check equations; and
    generating the second parity-check matrix by arranging the separated parity check equations.

5. A reception method of a receiver in a communication and broadcasting system, the method comprising:
    detecting an error in Low Density Parity Check (LDPC) decoding for a received codeword using a parity-check matrix;
    receiving additional parity bits among parity bits generated by a second parity-check matrix with the codeword, the additional parity bits being received separately from the codeword in time, space or frequency;
    generating the second parity-check matrix from the first parity-check matrix and the additional parity bits; and
    performing the LDPC decoding for the codeword using the second parity-check matrix.

6. The method of claim 5, wherein the first parity-check matrix is a matrix acquired from a transmitter or is a matrix previously stored in the receiver.

7. The method of claim 5, wherein the second parity-check matrix is generated using the first parity-check matrix by:
    selecting at least one parity check equation corresponding to a parity check equation in the first parity-check matrix;
    separating the selected at least one parity check equation into at least two parity check equations, respectively; and
    generating the second parity-check matrix by arranging the separated parity check equations.

8. An apparatus for transmitting in a communication and broadcasting system, the apparatus comprising:
    a parity-check matrix provider for generating a second parity-check matrix from a first parity-check matrix;
    a Low Density Parity Check (LDPC) encoder for performing LDPC encoding using the second parity-check matrix; and
    a transmitter for modulating a codeword corresponding to the first parity-check matrix, transmitting the modulated codeword, and transmitting additional parity bits, separately from the modulated codeword in time, space, or frequency, among parity bits generated by the second parity-check matrix.

9. The apparatus of claim 8, wherein the LDPC encoder receives an input information signal '$m=(m_0,m_1, \ldots, m_{k-1})$'; and outputs a codeword 'c',
    where 'c' satisfies '$H \cdot c^T = 0$' for a parity-check matrix 'H'.

10. The apparatus of claim 8, wherein the transmitter previously stores the first parity-check matrix and the second parity-check matrix, the parity-check matrix provider retrieves the second parity-check matrix from the previously stored parity-check matrixes.

11. The apparatus of claim 8, wherein the parity-check matrix provider generates the second parity-check matrix by:
    selecting at least one parity check equation corresponding to a parity check equation in the first parity-check matrix,
    separating each of the selected at least one parity check equation into at least two parity check equations, and
    generating the second pariy-check matrix by arranging the separated parity check equations.

12. An apparatus for receiving in a communication and broadcasting system, the apparatus comprising:
    a receiving unit for receiving a codeword, and receiving additional parity bits among parity bits generated by a second parity-check matrix with the codeword, the additional parity bits being received separately from the codeword in time, space or frequency;
    a parity-check matrix provider for generating the second parity-check matrix from a first parity-check matrix and the additional parity bits, when there is a Low Density Parity Check (LDPC) decoding error for the codeword; and
    an LDPC decoder for performing LDPC decoding for the codeword using the first parity-check matrix or performing LDPC decoding for the codeword using the second parity-check matrix.

13. The apparatus of claim 12, wherein the first parity-check matrix is acquired from a transmitter or is previously stored in the receiver.

14. The apparatus of claim 12, wherein the parity-check matrix provider generates the second parity-check matrix using the first parity-check matrix by;
    selecting at least one parity check equation corresponding to a parity check equation in the first parity-check matrix,
    separating each of the selected at least one parity check equation into at least two parity check equations, and
    generating the second parity-check matrix by arranging the separated parity check equations.

* * * * *